United States Patent
Ahn et al.

(10) Patent No.: US 7,132,708 B2
(45) Date of Patent: *Nov. 7, 2006

(54) SEMICONDUCTOR MEMORY DEVICE HAVING SELF-ALIGNED CONTACTS AND METHOD OF FABRICATING THE SAME

(75) Inventors: Tae-hyuk Ahn, Yongin (KR); Myeong-cheol Kim, Suwon (KR); Jung-hyeon Lee, Suwon (KR); Byeong-yun Nam, Suwon (KR); Gyung-jin Min, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/054,593

(22) Filed: Feb. 9, 2005

(65) Prior Publication Data

US 2005/0167758 A1 Aug. 4, 2005

Related U.S. Application Data

(62) Division of application No. 09/790,240, filed on Feb. 21, 2001, now Pat. No. 6,885,052.

(30) Foreign Application Priority Data

Jun. 27, 2000 (KR) .................................. 00-35704

(51) Int. Cl.
  H01L 27/108 (2006.01)
  H01L 29/76 (2006.01)
  H01L 29/94 (2006.01)
  H01L 31/119 (2006.01)

(52) U.S. Cl. .................... 257/296; 257/303; 257/306

(58) Field of Classification Search ............... 257/296, 257/303, 304, 306, 307, 906

See application file for complete search history.

(56) References Cited

U.S. PATENT DOCUMENTS 6,255,160 B1 * 7/2001 Huang ..................... 438/253
6,885,052 B1 * 4/2005 Ahn et al. ................. 257/296

FOREIGN PATENT DOCUMENTS

KR P1997-003953 6/1995
KR P2000-0015299 8/1998

* cited by examiner

Primary Examiner—Hoai Pham
(74) Attorney, Agent, or Firm—F. Chau & Associates, LLC

(57) ABSTRACT

A semiconductor memory device having self-aligned contacts, capable of preventing a short-circuit between contacts for bit lines and contacts for storage electrodes and improving a process margin, and a method of fabricating the same are provided. The semiconductor memory device having self-aligned contacts includes a plurality of gate electrode patterns arranged in parallel on a semiconductor substrate, in which a plurality of first spacers are formed along the sidewalls of the gate electrode patterns, a first interdielectric layer formed on the entire surface of a resultant in which the first spacers are formed, a plurality of bit line patterns arranged in parallel on the first interdielectric layer to be perpendicular to the gate electrode patterns, in which a plurality of second spacers are formed along the sidewalls of the bit line patterns, a plurality of contacts for bit lines self-aligned with the first spacers, a second interdielectric layer formed on the entire surface of a resultant in which the second spacers are formed, and a plurality of contacts for storage electrodes simultaneously self-aligned with the second and first spacers.

4 Claims, 11 Drawing Sheets

SEMICONDUCTOR MEMORY DEVICE HAVING SELF-ALIGNED CONTACTS AND METHOD OF FABRICATING THE SAME

CROSS-REFERENCE TO RELATED APPLICATION

This application is a Divisional of U.S. application Ser. No. 09/790,240 filed on Feb. 21, 2001, now U.S. Pat. No. 6,885,052, the disclosure of which in its entirety is incorporated herein by reference.

BACKGROUND OF THE INVENTION

1. Field of the Invention

The present invention relates to a semiconductor memory device having self-aligned contacts and a method of fabricating the same, and more particularly, to a semiconductor memory device having contacts for storage electrodes which are simultaneously self-aligned with bit lines and gate electrodes in the structure of a capacitor over bit line (COB) in which a capacitor is formed after the formation of the bit lines, and a method of fabricating the same.

2. Description of the Related Art

As the integration of semiconductor devices increases, the size of a unit cell in a memory cell per unit area is reduced. For example, in the case of a dynamic random access memory (DRAM), the cell size is reduced to less than 1.5 $\mu m^2$. Reduced cell size can be achieved by decreasing an interval between conductive layers of the cell, and in the case of DRAM, due to high integration, an interval between gate electrodes becomes a minimum feature size according to known design rules.

In addition, as the integration of semiconductor devices increases, the size of the contact holes connecting a lower interconnection layer to an upper interconnection layer, and the interval between contact holes, are reduced, while the aspect ratio of each contact hole is increased. Thus, the formation of contact holes using a photolithographic process in integrated semiconductor devices having a multi-layer interconnection structure is more difficult.

In DRAM, a capacitor over bitline (COB) structure has been developed for improvement of integration. In a COB, the capacitor is formed after the formation of bit lines. In addition, contacts (hereinafter referred to as a "contact for bit line" or a direct contact (DC)) for electrically connecting bit lines to drain regions, and contacts for electrically connecting storage electrodes to source regions (hereinafter referred to as a "contact for storage electrode" or a buried contact (BC)), must be formed. Drain regions are active regions formed around the surface of a semiconductor substrate. Storage electrodes are the lower electrodes of a semiconductor capacitor.

In cases where the contacts for bit lines and the contacts for storage electrodes comprise a conventional small contact type, a short-circuit can occur between the contacts for storage electrodes and contacts for bit lines in the design rule of less than 0.2 μm. Thus, in the COB structure above, in order to smoothly form the contacts for bit lines and the contacts for storage electrodes, pads for bit lines and pads for storage electrodes which are directly connected to the source regions, and the drain regions of the semiconductor substrate, are simultaneously formed. The contacts for bit lines and the contacts for storage electrodes, which are respectively connected to the pads, are then formed.

However, in the design rule of less than 0.15 μm, an interval between the pads for bit lines and the pads for storage electrodes is very narrow. At this size short-circuits can again occur between the contacts for bit lines and the contacts for storage electrodes even when the above methods are implemented.

Therefore, a need exists for a device having self-aligned contacts for preventing short-circuits between contacts for bit lines and contacts for storage electrodes, and a method of producing the same.

SUMMARY OF THE INVENTION

To solve the above problems, it is an object of the present invention to provide a semiconductor memory device having self-aligned contacts, in which an interval between contacts for bit lines and contacts for storage electrodes is maximized, thereby preventing short-circuit between the contacts for bit lines and the contacts for storage electrodes and increasing a process margin.

It is another object of the present invention to provide a method of fabricating a semiconductor memory device having self-aligned contacts, in which short-circuit between contacts for bit lines and contacts for storage electrodes is prevented and a process is simplified.

Accordingly, to achieve the above object, according to one aspect of the present invention, there is provided a semiconductor memory device having self-aligned contacts. The semiconductor memory device having self-aligned contacts includes a plurality of gate electrode patterns arranged in parallel on a semiconductor substrate, a plurality of first spacers formed along the sidewalls of the gate electrode patterns; a first interdielectric layer formed on the entire surface of a resultant in which the first spacers are formed, a plurality of bit line patterns arranged in parallel on the first interdielectric layer to be perpendicular to the gate electrode patterns, a plurality of contacts for bit lines, which are self-aligned with the first spacers, for electrically connecting active regions of the semiconductor device which are formed around the surface of the semiconductor substrate, to the bit line patterns, a plurality of second spacers formed along the sidewalls of the bit line patterns, a second interdielectric layer formed on the entire surface of a resultant in which the second spacers are formed, and a plurality of contacts for storage electrodes, which are simultaneously self-aligned with the second and first spacers, for electrically connecting the active regions of the semiconductor device which are formed around the surface of the semiconductor substrate, to storage electrodes of a capacitor.

An insulated first mask layer is further formed on an uppermost layer of the gate electrode patterns, and the first mask layer and the first spacers have etching selectivity with respect to the first interdielectric layer. Preferably, the first mask layer and the first spacers are formed of a silicon nitride film, and the first interdielectric layer is formed of a silicon oxide film.

An insulated second mask layer is further formed on the bit line patterns, and the second mask layer and the second spacers have etching selectivity with respect to the first and second interdielectric layers. Preferably, the second mask layer and the second spacers are formed of a silicon nitride film, and the first and second interdielectric layers are formed of a silicon oxide film.

The contacts for bit lines may be projected to a predetermined height upwards from the surfaces of the gate electrode patterns, and the height of the surfaces of the contacts for bit lines may be less than the height of the surfaces of the gate electrode patterns.

Meanwhile, storage electrodes connected to the contacts for storage electrodes are further included in the second interdielectric layer.

In order to achieve the object, according to another aspect of the present invention, there is provided a semiconductor memory device having self-aligned contacts. The semiconductor memory device having self-aligned contacts includes a plurality of active regions, each of the plurality of active regions horizontally extended to a predetermined length at the surface of a semiconductor substrate, separated from one another in a row at a predetermined interval and arranged to be shifted to a half cycle with a neighboring row, a plurality of gate electrode patterns, a pair of the gate electrode patterns arranged in parallel on the semiconductor substrate to be perpendicular to the extended direction of each of the active regions, and having a plurality of first spacers along the sidewalls of the gate electrode patterns, a first interdielectric layer formed on the entire surface of a resultant in which the first spacers are formed, a plurality of bit line patterns arranged in parallel on the first interdielectric layer to be perpendicular to the gate electrode patterns, and having a plurality of second spacers along the sidewalls of the bit line patterns, a plurality of contacts for bit lines, which are formed between the pair of the gate electrode patterns for each of the active regions and self-aligned with the first spacers, for electrically connecting the active regions to the bit line patterns, a second interdielectric layer formed on the entire surface of the first interdielectric layer in which the plurality of the bit line patterns are formed, and a plurality of contacts for storage electrodes, which are formed on each outer end of the pair of the gate electrode patterns for each of the active regions and simultaneously self-aligned with the second and first spacers, for electrically connecting the active regions to storage electrodes of a capacitor.

The contacts for bit lines may be projected to a predetermined height upwards from the surfaces of the gate electrode patterns, and the height of the surfaces of the contacts for bit lines may be less than the height of the surfaces of the gate electrode patterns.

The contacts for storage electrodes are arranged to be the maximum deflection to the outside of the active regions so as to increase a spaced-apart distance between the contacts for bit lines and a pair of the contacts for storage electrodes for each of the active regions, and the contacts for storage electrodes are formed between the same gate electrode patterns among the plurality of gate electrode patterns, and the center of the contacts for storage electrodes is formed in a staggered row arrangement along a vertical direction.

In order to achieve another object, there is provided a method of fabricating a semiconductor memory device having self-aligned contacts. The method of fabricating a semiconductor memory device having self-aligned contacts comprises the steps of: forming a plurality of gate electrode patterns arranged in parallel by interposing a gate dielectric layer on a semiconductor substrate on which active regions are formed; forming a plurality of first spacers along the sidewalls of the gate electrode patterns; forming a first interdielectric layer on a resultant in which the first spacers are formed; etching the first interdielectric layer to be self-aligned with the first spacers, filling the etched first interdielectric layer with a conductive material and forming a plurality of contacts for bit lines connected to the active regions of the semiconductor substrate; forming a plurality of bit line patterns connected to the surfaces of the contacts for bit lines arranged in parallel on the first interdielectric layer to be perpendicular to the gate electrode patterns; forming a plurality of second spacers along the sidewalls of the bit line patterns; forming a second interdielectric layer on a resultant in which the second spacers are formed; and etching the second and first interdielectric layers to be simultaneously self-aligned with the second and first spacers, filling the etched second and first interdielectric layers with a conductive material and forming a plurality of contacts for storage electrodes connected to the active regions of the semiconductor substrate.

The second interdielectric layer and the first interlevel dielectric layer are sequentially etched in the step of forming the contacts for storage electrodes.

The plurality of active regions are horizontally extended to a predetermined length at the surface of a semiconductor substrate, separated from one another in a row at a predetermined interval and arranged to be shifted to a half cycle with a neighboring row, and the pair of the gate electrode patterns are arranged in parallel on the semiconductor substrate to be perpendicular to the direction of each of the active regions, and the plurality of contacts for bit lines are formed between the pair of the gate electrode patterns for each of the active regions, and the plurality of contacts for storage electrodes are formed on each outer end of the pair of the gate electrode patterns for each of the active regions.

An etchback or chemical-mechanical polishing (CMP) process is further performed in the step of forming the contact for bit lines in the first interdielectric layer so that the height of the surfaces of the contacts for bit lines after filling the removed first interdielectric layer with a conductive material may be less than the height of the surfaces of the gate electrode patterns.

According to the present invention, since the contacts for storage electrodes are self-aligned with the bit line patterns and the gate electrode patterns, short-circuit between the contacts for bit lines and the contacts for storage electrodes can be prevented. Also, since the height of the surfaces of the contacts for bit lines is formed of the height less than the height of the surfaces of the contacts for gate electrode patterns, a distance between the contacts for bit lines and the contacts for storage electrodes is spaced-apart, and then, short-circuit between the contacts for bit lines and the contacts for storage electrodes can be prevented, and further since the contacts for storage electrodes with respect to the contacts for bit lines can be arranged at a maximum distance, short-circuit between the contacts for bit lines and the contacts for storage electrodes can be prevented, and simultaneously, an adequate process margin for the selection of the position of a contact hole can be obtained.

In addition, according to the prior art, the contacts for bit lines and the contacts for storage electrodes are formed after pads for bit lines and pads for storage electrodes are formed, however, according to the present invention, the pads are not formed, and thereby, the process is simplified.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1A:
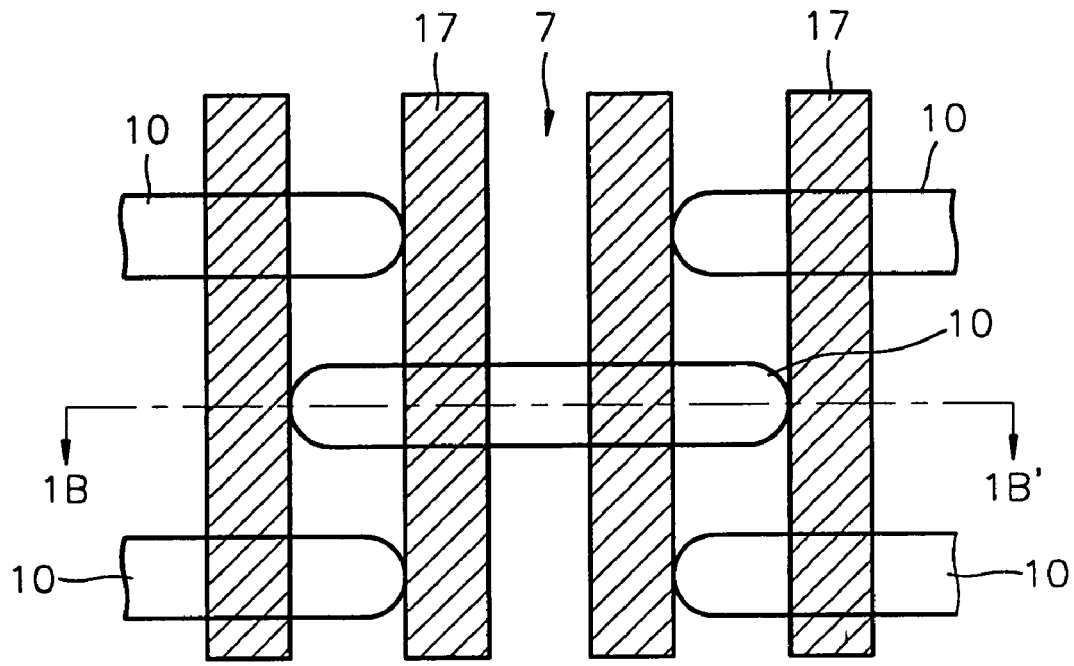
FIGS. 1A, 1B, 2A, 2B, 3A, 3B, 3C, 4A, 4B, and 4C are diagrams illustrating a method of fabricating a semiconductor memory device according to a preferred embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 1B:
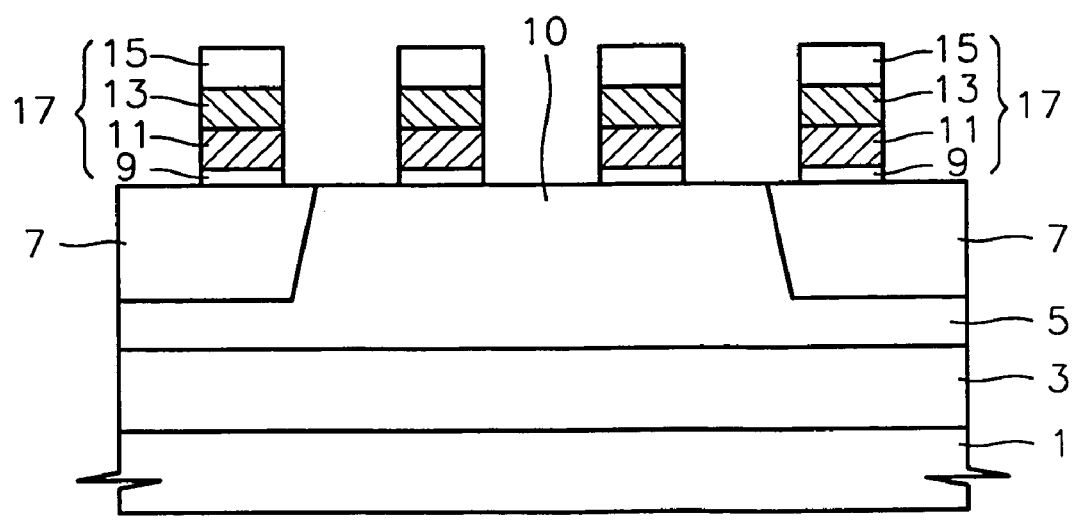

FIG. 1A is a plan view illustrating steps of forming gate electrode patterns, and FIG. 1B is a sectional view taken along line 1B–1B' of FIG. 1A.

Referring to FIGS. 1A and 1B, second conductivity type impurities, for example, an n-type buried impurities layer 3 and a p-type well 5 for forming an NMOS transistor are sequentially formed by a conventional method, for example, by implanting impurity ions around the surface of a semiconductor substrate 1 formed of a material having first conductive type impurities, for example, a p-type semiconductor material. Device isolation regions 7 are formed by a conventional device isolation process, for example, a local oxidation of silicon (LOCOS) process or a trench process on the surface of the p-type well 5. The semiconductor substrate 1 is divided into active regions 10 and the device isolation regions 7 which are non-active regions. Although reference numeral "1" representing a semiconductor substrate is marked only on a lowermost layer in FIG. 1B, it is well know that a general semiconductor substrate includes the well 5 on which the active regions 10 are formed, and the buried impurities layer 3.

The device isolation regions 7 are formed using a conventional shallow trench isolation (STI) process as follows. An oxide film for buffer (not shown), a nitride film for mask (not shown), and a photoresist layer (not shown) are sequentially formed on the semiconductor substrate 1 on which the buried impurities layer 3 and the well are formed, and a photoresist pattern for defining the non-active regions is formed using a photolithographic process. The nitride film for mask and the oxide film for buffer are anisotropically etched using the photoresist pattern, and the semiconductor substrate 1 of the non-active regions is exposed. A trench is formed by anisotropically etching the exposed semiconductor substrate 1 to the depth about 3,000~5,000 Å using the nitride film for mask and the oxide film for buffer as an etching mask, and an oxide film is deposited, for example, using a chemical vapor deposition (CVD) method on the trench. The surface of the semiconductor substrate 1 is planarized by an etchback or chemical-mechanical polishing (CMP) process, and the device isolation regions 7 which are planarized on the surface of the semiconductor substrate 1, are formed by removing the nitride film and the oxide film for buffer which are resident on the semiconductor substrate.

A gate dielectric layer 9 is formed by depositing a certain insulating layer such as the oxide film or the nitride film on the semiconductor substrate 1 on which the device isolation regions 7 are formed. A polysilicon layer 11 and a silicide layer 13 in which a dopant is doped on the gate dielectric layer 9, are sequentially formed by a conventional method. A first mask layer 15 formed of a nitride film is deposited, for example, using a low pressure CVD (LPCVD) or a plasma enhanced CVD (PECVD) method on the polysilicon layer 11 and the silicide layer 13. Gate electrode patterns 17 are formed by a photolithographic process. Impurity regions (not shown) which are self-aligned with the gate electrode pattern 17, are formed by implanting impurity ions on the entire surface of the semiconductor substrate 11 using the gate electrode patterns 17 as an ion implantation mask around the surface of the well 5 on which the active regions 10 are formed.

As shown in FIG. 1A, the surface of the semiconductor substrate 1 is divided into the active regions 10 and the device isolation regions 7 for defining the active regions 10, and each of the active regions 10 is horizontally extended to a predetermined length and formed to be shifted to a half cycle with a row of the neighboring active regions 10. Also, a pair of gate electrode patterns 17 are arranged in parallel on each of the active regions 10.

Figure 2A:
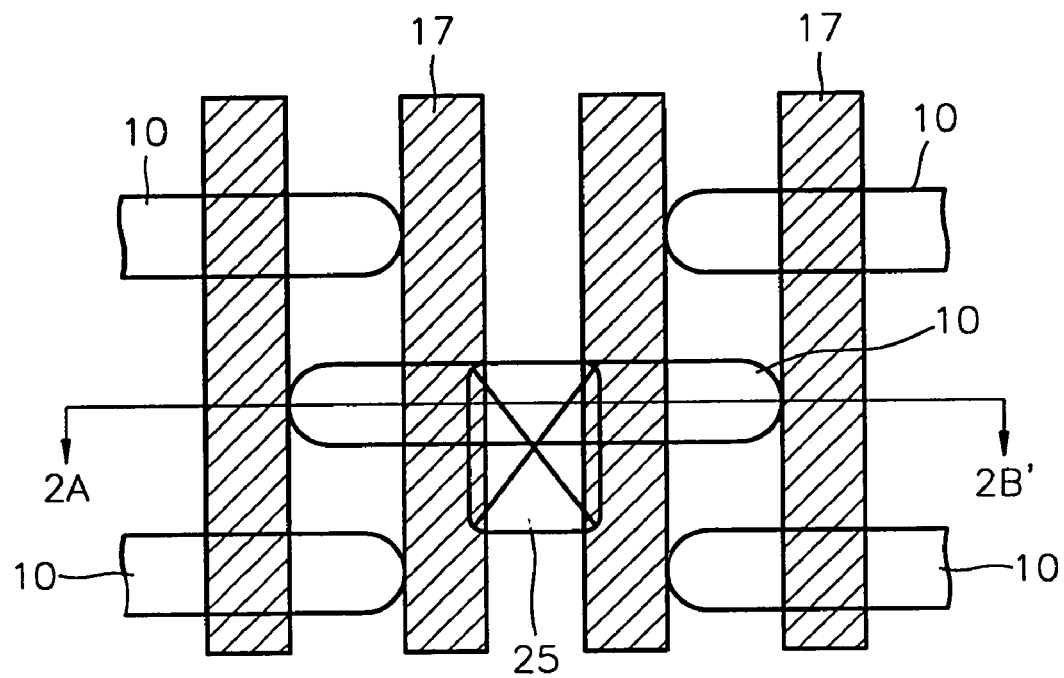
Figure 2B:
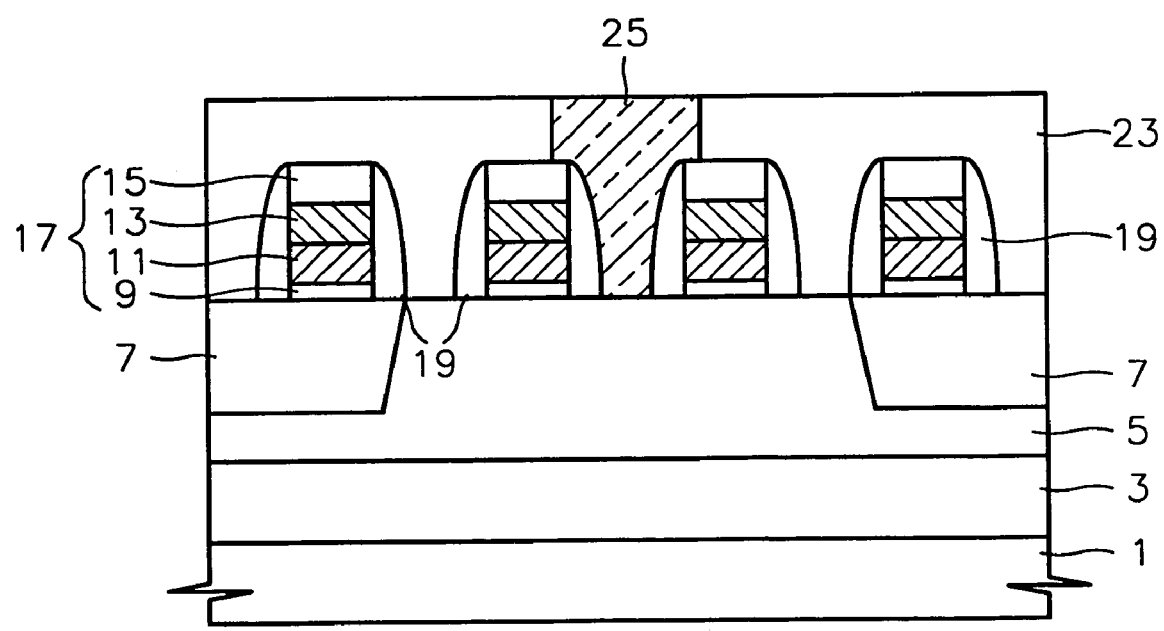

FIG. 2A illustrates steps for forming contacts for bit lines, and FIG. 2B is a sectional view taken along line 2B–2B' of FIG. 2A.

Referring to FIGS. 2A and 2B, a nitride film is deposited to a predetermined thickness, for example, using a PECVD or LPCVD method on a resultant in which the gate electrode patterns 17 are formed. The entire surface of the substrate is etched back, and first spacers 19 are formed on the sidewalls of the gate electrode patterns 17. The first spacers 19 function as an etch stopping layer for self-aligning contacts for bit lines by preventing the gate electrode patterns 17 from being etched in the following etching process of forming the contacts for bit lines.

An insulating layer about 5,000~8,000 Å thick, for example, a borophosphosilicate glass (BPSG) layer which is a silicon oxide film containing boron-phosphor having etching selectivity with respect to the first mask layer 15 and the first spacers 19, is deposited using the conventional CVD method. A first interdielectric layer 23 for filling the first spacers 19 is formed. The surface of the first interdielectric layer 23 is planarized by a conventional planarization process such as a CMP process.

A contact hole for exposing the active regions 10 of the semiconductor substrate 1 is formed by etching the first dielectric layer 23 using a photolithographic process. The contact hole, as shown in FIG. 2A, is self-aligned with the first spacers 19 between the first spacers 19 formed the sidewalls of the pair of the gate electrode patterns 17 which are the center of each of the active regions 10.

A conductive material, for example, a polysilicon layer in which a dopant is doped, is deposited to a predetermined thickness on the resultant in which the contact hole for exposing the active regions 10 of the semiconductor substrate 1 is formed and an etchback or CMP process is performed, to thereby form contacts for bit lines 25 filled with the conductive material. The contacts for bit lines 25 electrically connect bit lines to be formed in the following process to the active regions 10 of the semiconductor substrate 1.

Figure 3A:
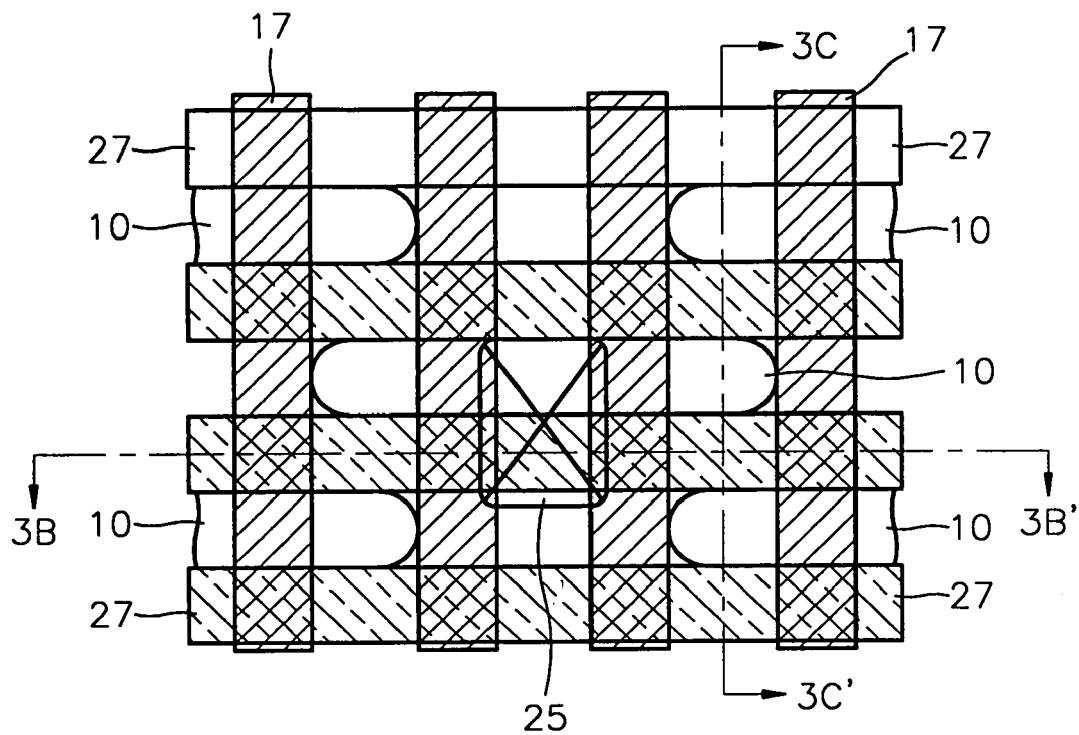
Figure 3B:
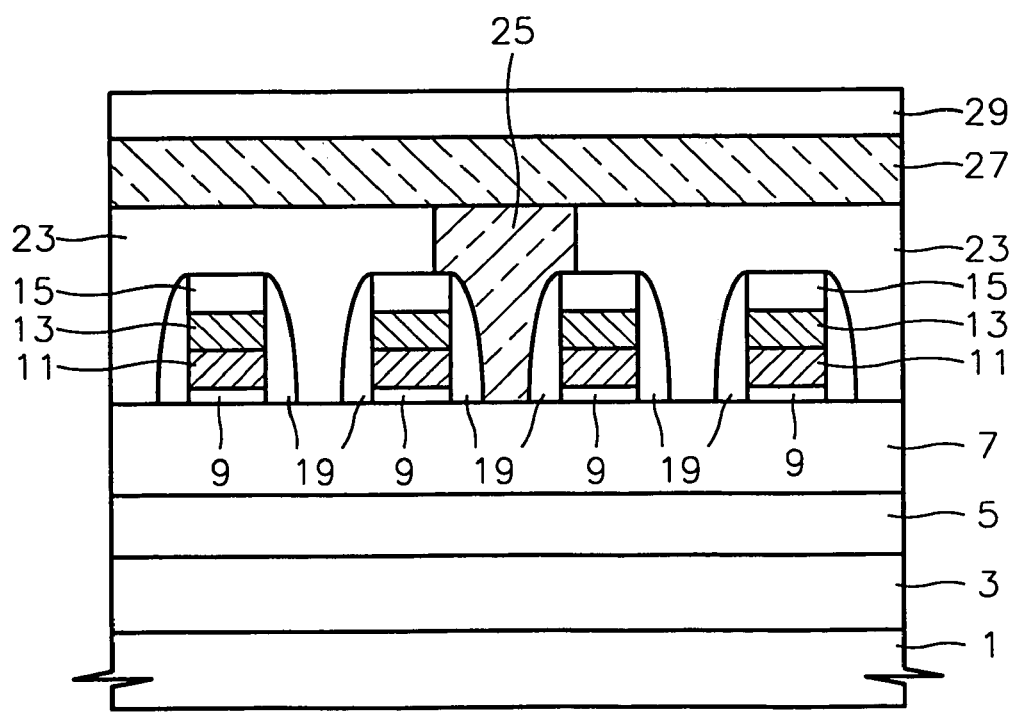
Figure 3C:
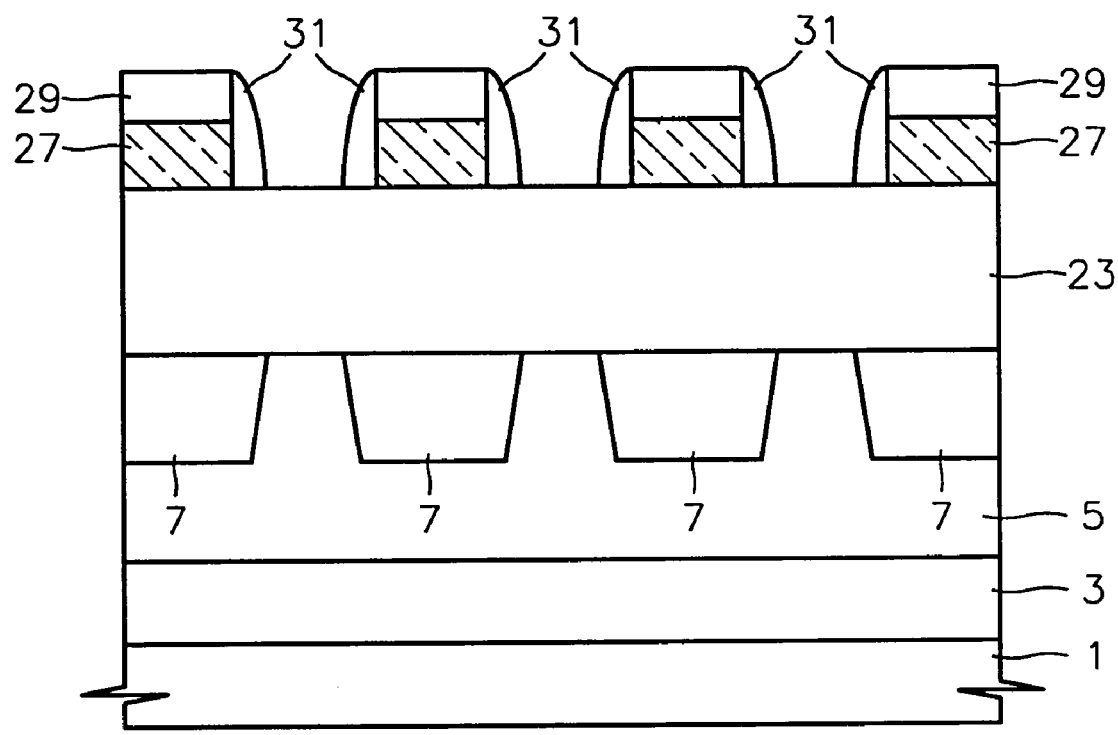

FIG. 3A illustrates steps for forming bit line patterns, FIG. 3B is a sectional view taken along line 3B–3B' of FIG. 3A, and FIG. 3C is a sectional view taken along line 3C–3C' of FIG. 3A.

Specifically, a conductive layer for bit lines is formed by sequentially depositing a conductive material, for example, a tungsten (W) film, a titanium (Ti) film, or the tungsten (W) film and a titanium nitride (TiN), to a predetermined thickness on the entire surface of a resultant in which contacts for bit lines 25 are formed. A second mask layer 29 is formed by depositing a predetermined thickness of a nitride film using a PECVD or LPCVD method on the conductive layer for bit lines.

Regions in which the bit lines are to be formed are defined by a photolithographic process. A second mask layer 29 and a conductive layer for bit lines 27 are sequentially etched, and bit line patterns formed of the second mask layer 29 and the conductive layer for bit lines 27 are formed. The bit line patterns, as shown in FIG. 3A, are formed perpendicular to the gate electrode patterns 17 between the active regions 10. The contacts for bit lines 25 overlap with lower portions of the bit line patterns. The bit line patterns are connected to the active regions 10 of the semiconductor substrate 1 by the contacts for bit lines 25 which are self-aligned with the first spacers 19 formed on the sidewalls of the gate electrode patterns 17.

Alternatively, another interdielectric layer (not shown) may be further formed on the first interdielectric layer 23 before the conductive layer for bit lines 27 is formed on the first interdielectric layer 23, and the contact hole for exposing the contacts for bit lines 25 is formed. The conductive layer for bit lines 27 are formed on the entire surface of another interdielectric layer by filling the contact hole.

After the formation of the bit line patterns, the nitride film is deposited on the entire surface of the first interdielectric layer 23 by the LPCVD or PECVD method and etched back. Second spacers 31 are formed on the sidewalls of the bit line patterns.

Figure 4A:
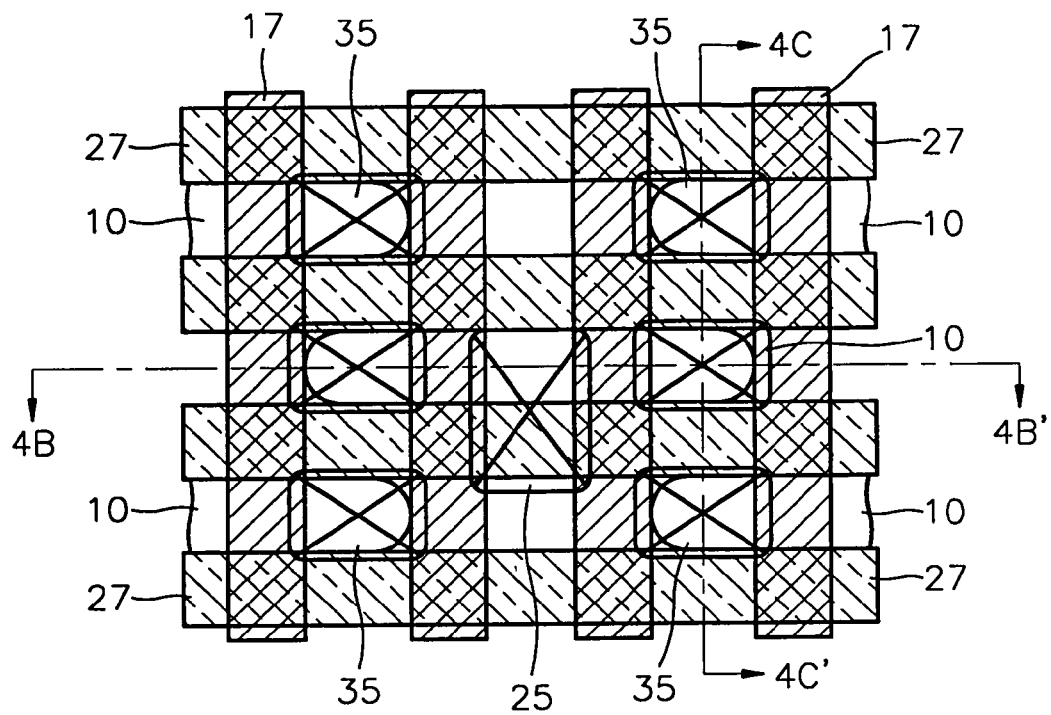
Figure 4B:
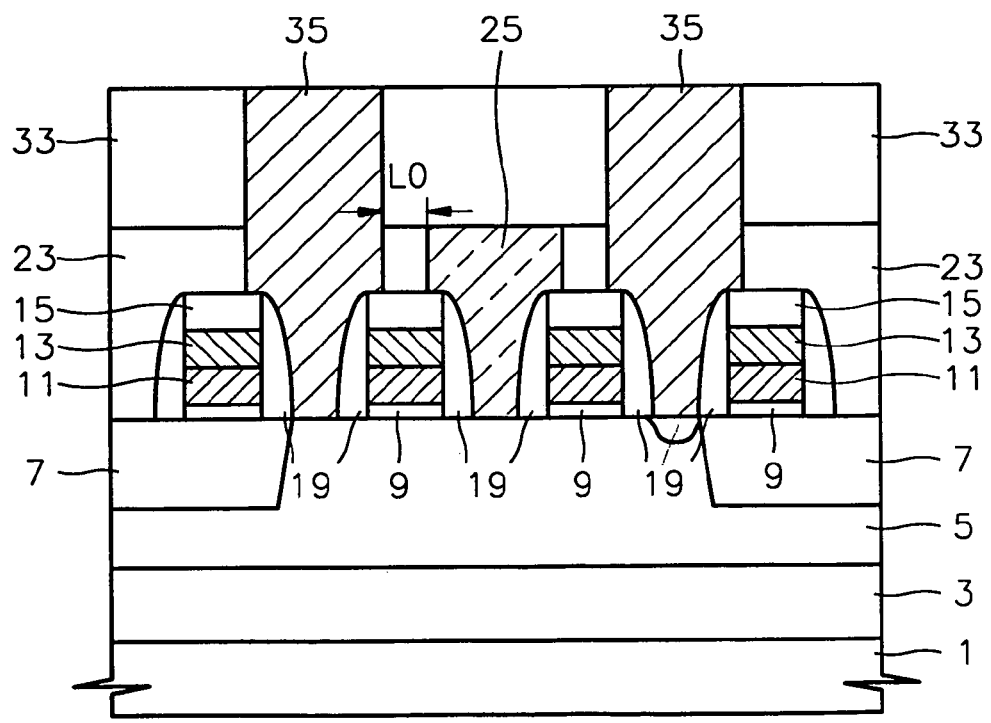
Figure 4C:
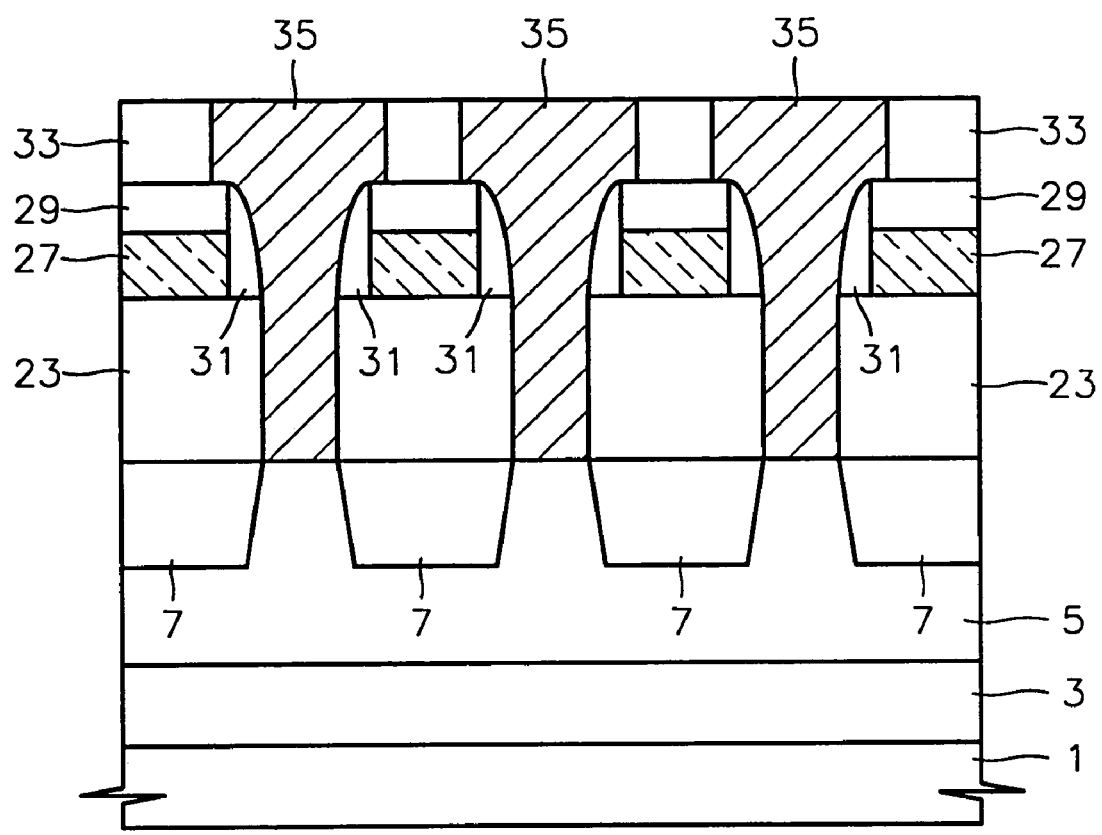

FIG. 4A illustrates steps for forming contacts for storage electrodes, and FIGS. 4B and 4C are sectional views taken along lines 4B–4B' and 4C–4C' of FIG. 4A.

Specifically, the second spacers 31 are formed on the sidewalls of the bit line patterns. A second interdielectric layer 33 for filling between the second spacers 31 is formed by depositing a silicon oxide film having etching selectivity with respect to the second mask layer 29 and the second spacers 31, for example, a borophosphosilicate glass (BPSG) layer containing boron-phosphor on a resultant in which the second spacers 31 are formed. A material having etching selectivity with respect to the second mask layer 29, the second spacers 31, the first mask layer 15, and the first spacers 19 is used as the second interdielectric layer 33 and the first interdielectric layer 23 in the following etching process of forming the contacts for storage electrodes.

The active regions 10 of the semiconductor substrate 1, particularly, a photoresist pattern (not shown) having the form for exposing the second interdielectric layer 33 on an upper portion of source regions of a transistor is formed on the second interdielectric layer 33 using a photolithographic process. The contact hole for exposing the source regions of the semiconductor substrate is formed by sequentially etching the second interdielectric layer 33 and the first interdielectrci layer 23 using the photoresist pattern as an etching mask. Here, the contact hole is simultaneously self-aligned with the second spacers 31 formed along the sidewalls of the bit line patterns and in the first spacers 19 formed along the sidewalls of the gate electrode patterns 17.

A conductive material, for example, a polysilicon layer in which a dopant is doped, is deposited on the resultant in which the contact hole is formed and an etchback or CMP process is performed, and contacts for storage electrodes 35 connected to the active regions 10 of the semiconductor substrate 1 are formed by filling the contact hole. Here, the etchback process is a process in which a material to be etched is etched at a constant speed from an upper portion of the substrate, and the CMP process is a process in which a material to be etched is etched to the same depth from the upper portion of the substrate.

In general, a capacitor of semiconductor memory devices can be fabricated by forming a storage electrode, a dielectric layer, and a plate electrode on a resultant in which the contacts for storage electrodes are formed. It is evident that the storage electrode can be formed in a stack type, or a cylindrical type for increasing cell capacitance, and other various types.

Figure 5:
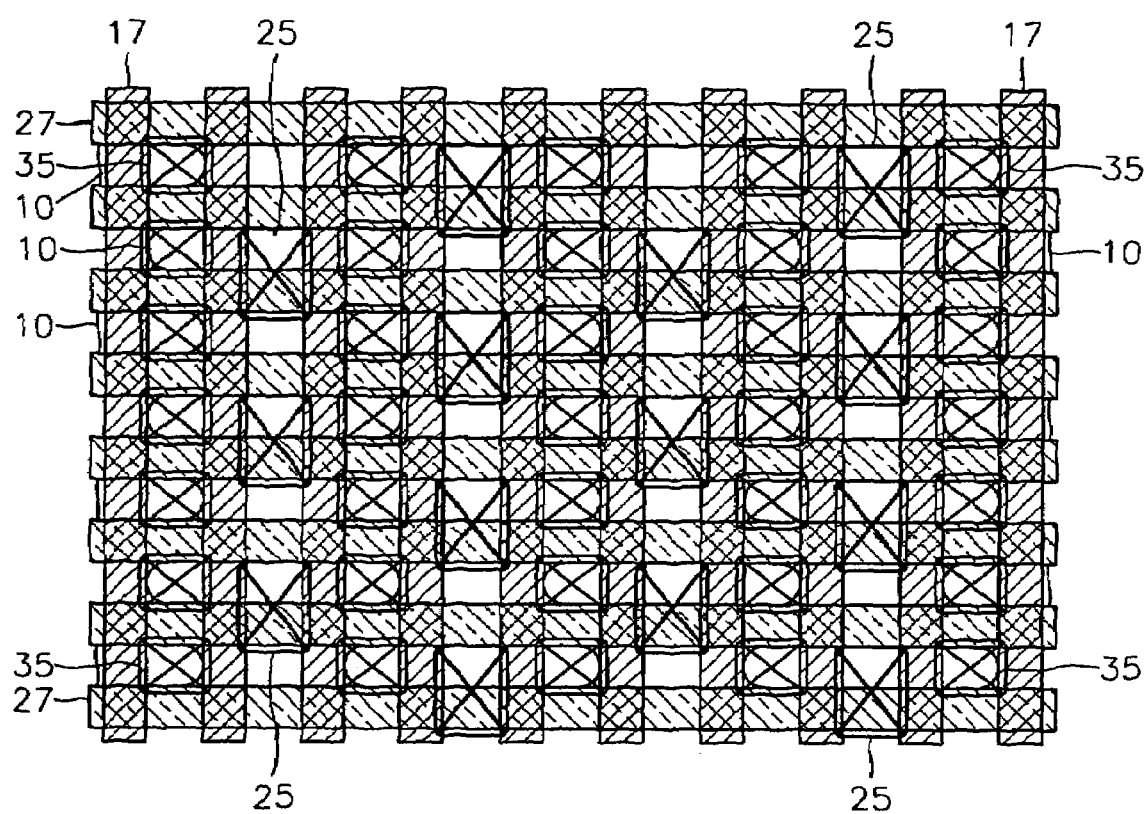
FIG. 5 is an illustration of the extended horizontal region of the semiconductor memory device according to FIGS. 1A through 4C.

Referring to FIG. 5, which is a diagram in which a plan view shown in FIG. 4A is extended, a plurality of the active regions 10 having a predetermined length in a horizontal direction are isolated from one another at a predetermined interval and arranged to be shifted to a half cycle with a row of the neighboring active regions 10. Also, a pair of gate electrode patterns 17 are arranged in parallel on each of the active regions 10 at a predetermined interval.

A plurality of bit line patterns are insulated by the first dielectric layer 23 on the gate electrode patterns 17 and formed perpendicular to the gate electrode patterns 17 between the active regions 17. The contacts for bit lines 25 and the contacts for storage electrodes 35 are distinguishably formed between the gate electrode patterns 17. That is, the contacts for bit lines 25 and the contacts for storage electrodes 35 are alternately formed between the gate electrode patterns 17, and the contacts for storage electrodes 35 are formed one by one in regions surrounded by the gate electrode patterns 17 and the bit line patterns, whereas the contacts for bit lines 25 are alternately formed in regions surrounded by the gate electrode patterns 17 and the bit line patterns. In one embodiment, the center of the contacts for storage electrodes 35 is vertically arranged in straight rows.

According to one embodiment of the present invention, a method is provided for fabricating a semiconductor memory device. The contacts for storage electrodes are simultaneously self-aligned with the second spacers formed along the sidewalls of the bit lines and in the first spacers formed along the sidewalls of the gate electrode patterns, thereby preventing short-circuit between the contacts for bit lines and the contacts for storage electrodes by a simple process and fabricating a semiconductor memory device of which a process margin is improved.

In a preferred embodiment, as shown in FIG. 4B, contacts for bit lines 25 and contacts for storage electrodes 35 are separated by a first interdielectric layer 23, however, a distance L0 between the contacts for bit lines 25 and the contacts for storage electrodes 35 is very close, as a result, a process margin for misalignment is very small. Thus, even in a case where the misalignment occurs in a photolithographic process of forming the contacts for storage electrodes 35 in a state in which the contacts for bit lines 25 are formed, short-circuit between the two contacts can be prevented.

Figure 6A:
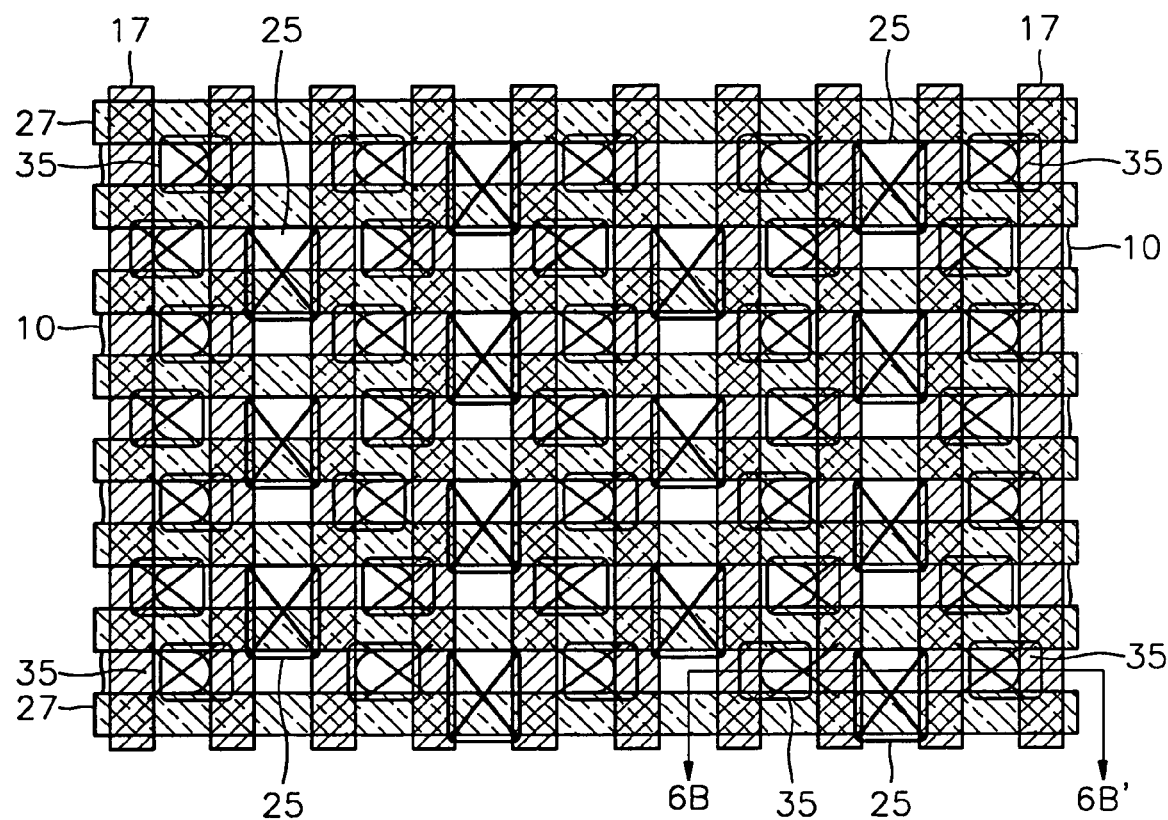
FIG. 6A is an illustration of a semiconductor memory device according to another preferred embodiment of the present invention.
Figure 6B:
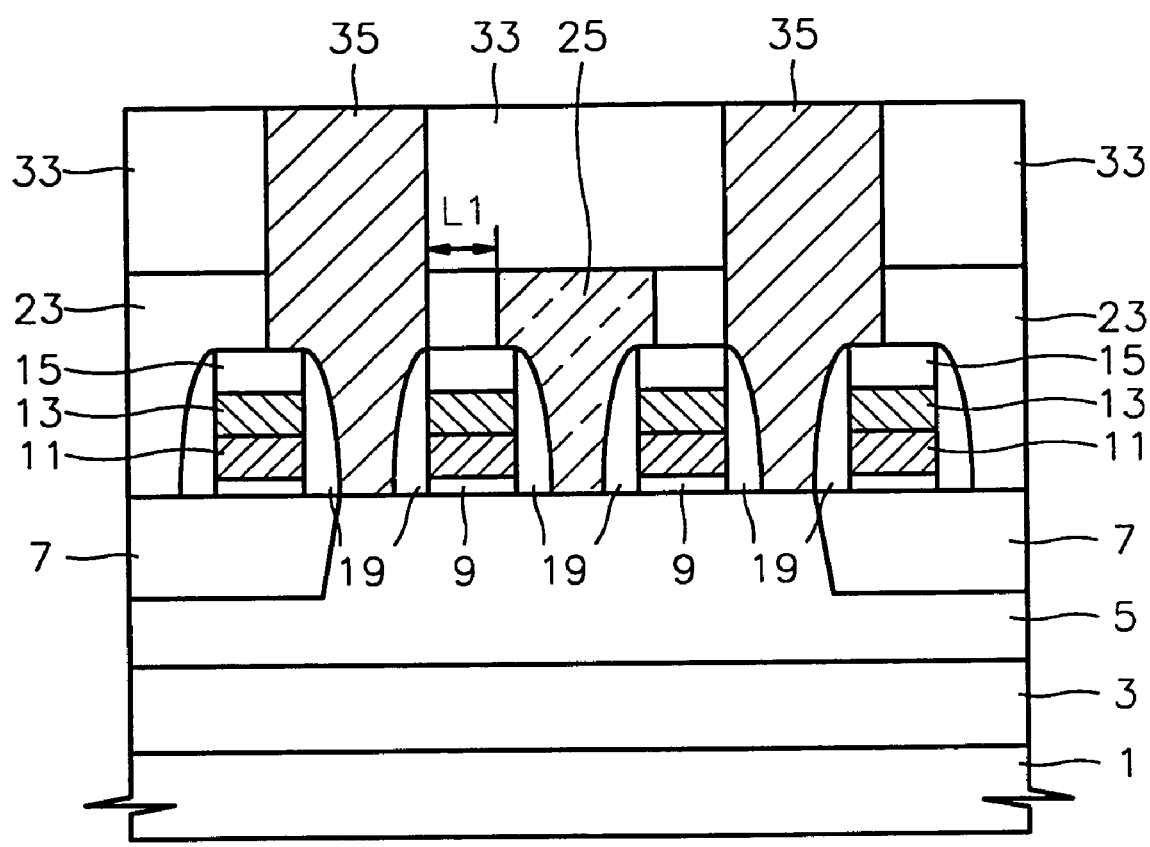
FIG. 6B is a sectional view taken along line 6B–6B' of FIG. 6A.

FIG. 6A illustrates a semiconductor memory device according to a preferred embodiment of the present invention, FIG. 6B is a sectional view taken along line 6B–6B' of FIG. 6A, and like reference numerals in FIGS. 1 through 5 refer to like elements.

Referring to FIG. 6A, comparing with FIG. 5, the center of the contacts for storage electrodes 35 formed on outer end of each of gate electrode patterns 17 is arranged to be the maximum deflection to outside, being centered at the contacts for bit lines 25 arranged on the center between a pair of gate electrode patterns 17 for each of active regions 10. The contacts for storage electrodes 35 are formed in a staggered row arrangement along a vertical direction. This means that the center of the contacts for bit lines 25 is unchangeable, and the contacts for storage electrodes 35 formed on both outer ends of each of the gate electrode patterns 17 are the maximum deflection to outside within a range of the contacts for storage electrodes 35, for each of the active regions 10. The contacts for storage electrodes 35 are arranged to be shifted to a half cycle with a row of the neighboring active regions 10 along the vertical direction.

The range in which the center of the contacts for storage electrodes 35 is deflected to outside allows the center of the contacts for storage electrodes 35 to be at least arranged between the gate electrode patterns 17 and the contacts for storage electrodes 35 to be self-aligned with the first spacers 19 formed along the sidewalls of the gate electrode patterns 17, and the bottom sides of the contacts for storage electrodes 35 contacts with the entire surfaces of the active regions 10 of the semiconductor substrate 1 exposed by the neighboring first spacers 19, thereby preventing a decrease in a contact area.

Referring to FIG. 6B, although the sidewalls of the contacts for bit lines 25 and the sidewalls of the gate electrode patterns 17 are formed in straight rows, this invention should not be construed as being limited to the embodiment set forth herein. As shown in FIG. 6B, a distance L1 between the contacts for bit lines 25 and the contacts for storage electrodes 35 is longer than the distance L0 shown in FIG. 4B. A process margin for misalignment can be increased during a photolithographic process of forming the contacts for storage electrodes 35.

Figure 7A:
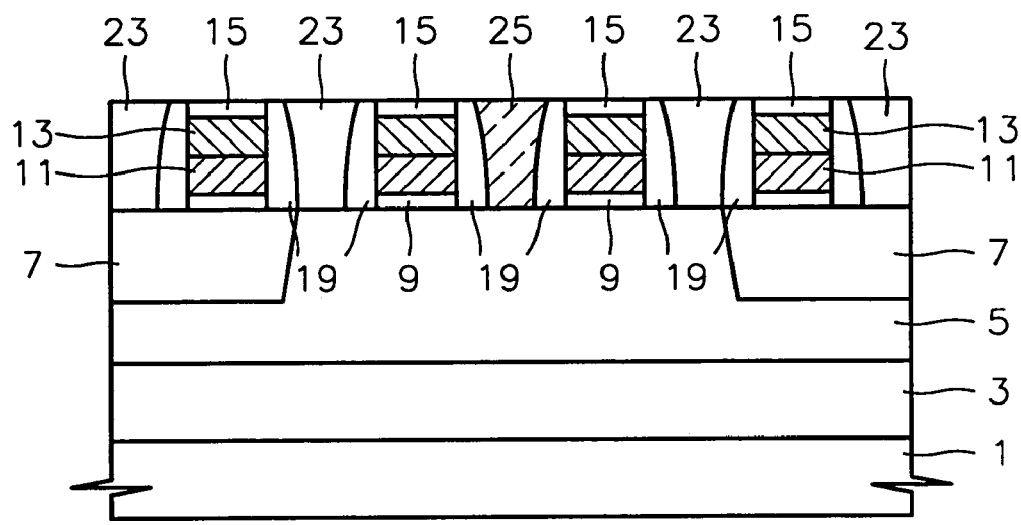
FIGS. 7A and 7B are sectional views taken along line 6B–6B' of FIG. 6A illustrating a method of fabricating a semiconductor memory device according to still another preferred embodiment of the present invention.
Figure 7B:
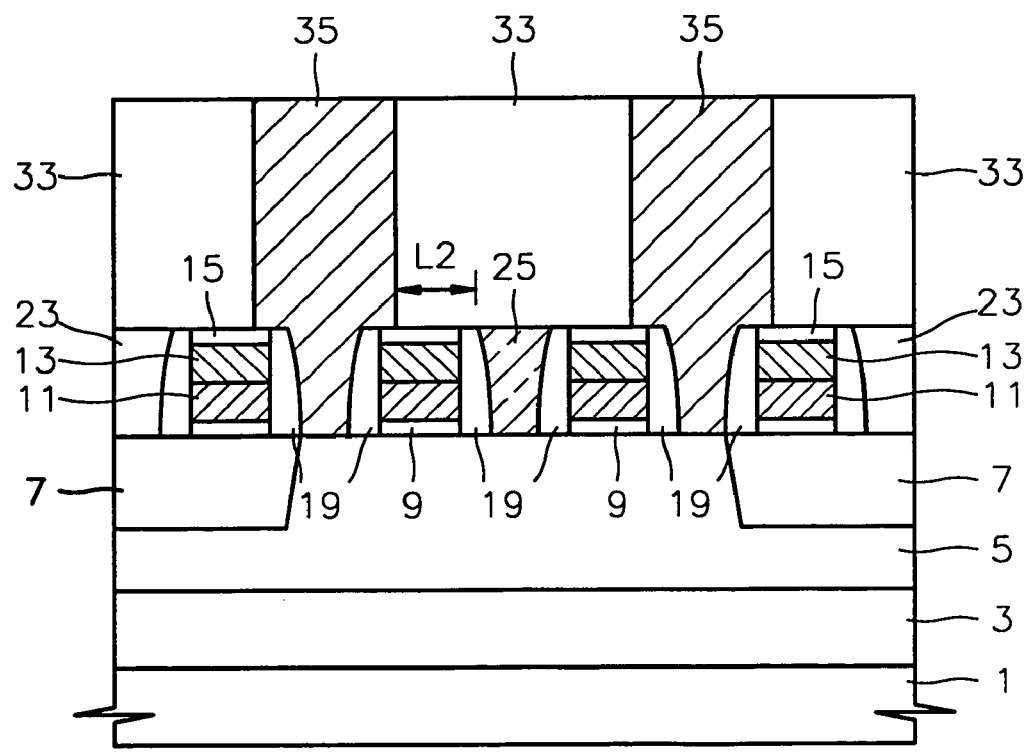

One embodiment of the present invention exhibits another method for preventing short-circuits between the contacts for bit lines 25 and the contacts for storage electrodes 35. FIGS. 7A and 7B are sectional views taken along line 6B–6B' of FIG. 6A illustrating a method of fabricating a semiconductor memory device according to a preferred embodiment of the present invention.

Specifically, as shown in FIG. 2B, contact holes for bit lines are formed, and a conductive layer, for example, a doped polysilicon layer is deposited on the entire surface of the substrate, and a CMP process or etchback process is performed until the first mask layer 15 formed on an uppermost layer of the gate electrode patterns 17 is exposed. Here, the first mask layer 15 can be etched. In order to obtain insulation characteristics between gate electrodes 11 and 13 and the following contacts for storage electrodes 35, as shown in FIG. 7A, preferably, the first mask layer 15 needs to be about half of its initial height after etching. The surface height of the contact for bit lines 25 which remains after selectivity etching between materials for forming the first mask layer 15 and the contacts for bit lines 25 can be higher or lower than the height of the surface of the remaining first mask layer 15, or the same as the height of the surface of the remaining first mask layer 15.

Subsequently, the following processes of forming the second dielectric layer 33 and the contacts for storage electrodes 35 are performed by the methods disclosed above referring to FIGS. 4A and 4B. As shown in FIG. 7B, comparing with FIG. 4B, since projected portions of the contacts for bit lines 25 (that is, portions which are projected upwards from the first mask layer 15 and extended to a predetermined length) are removed, as in the first embodiment, a distance L2 between the contacts for bit lines 25 and the contacts for storage electrodes 35 is increased. Thus, short-circuit between the contacts for bit lines 25 and the contacts for storage electrodes 35 can be easily prevented, and a process margin for misalignment can be improved during a photolithographic process of forming the contacts for storage electrodes 35.

Figure 8:
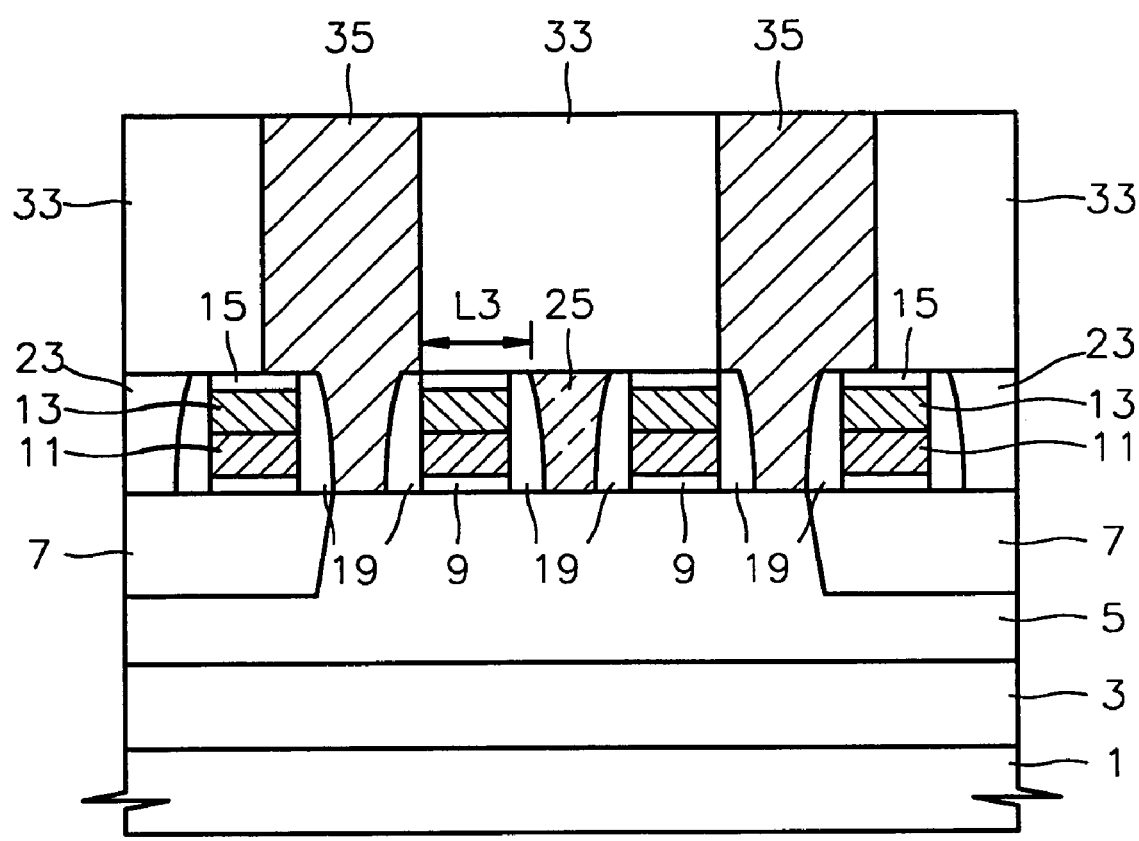
FIG. 8 is a sectional view taken along line 6B–6B' of FIG. 6A illustrating a method of fabricating a semiconductor memory device according to a preferred embodiment of the present invention.

Referring to FIG. 8, a sectional view taken along line 6B–6B' of FIG. 6A, illustrating a method of fabricating a semiconductor memory device according to a preferred embodiment of the present invention. The center of the contacts for storage electrodes 35 are the maximum mobility to outer ends of the active regions 10, and simultaneously, the surface heights of the contacts for bit lines 25 is reduced to the height of the gate electrode patterns 17, and a distance L3 between the contacts for bit lines 25 and the contacts for storage electrodes 35 is larger. Thus, short-circuits between the contacts for bit lines 25 and the contacts for storage electrodes 35 can be more effectively prevented.

According to the present invention, the contacts for storage electrodes are formed to be simultaneously self-aligned with the spacers, which are formed on the sidewalls of the bit lines and the gate electrode patterns, thereby preventing short-circuits between the contacts for bit lines and the contacts for storage electrodes by a simple process and fabricating a semiconductor memory device of which process margin is improved.

In addition, the contacts for storage electrodes are formed in a staggered row arrangement to be the maximum deflection to outside of each of the active regions, thereby increasing the interval between the contacts for bit lines and the contacts for storage electrodes and increasing a process margin for misalignment in a photolithographic process of forming the contacts for storage electrodes.

Further, when a CMP or etchback process is performed in a state in which the contacts for bit lines are formed and a conductive layer is deposited on the entire surface of the contacts of the bit lines, the contacts for bit lines are etched to the height of the mask layer, thereby increasing the distance between the contacts for bit lines and the contacts for storage electrodes and more effectively preventing short-circuit between the contacts for bit lines and the contacts for storage electrodes.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory device having a plurality of self-aligned contacts comprising:

a plurality of active regions, each active region horizontally extended to a predetermined length at a surface of a semiconductor substrate, separated from one another in a row at a predetermined interval and arranged to be shifted to a half cycle with a neighboring row;

a plurality of gate electrode patterns, a pair of the gate electrode patterns arranged in parallel on the semiconductor substrate, perpendicular to the extended direction of each of the active regions, and having a plurality of first spacers along a plurality of sidewalls of the gate electrode patterns;

a first interdielectric layer formed on an entire surface of a resultant in which the first spacers are formed;

a plurality of bit line patterns arranged in parallel on the first interdielectric layer, perpendicular to the gate electrode patterns, and having a plurality of second spacers along the sidewalls of the bit line patterns;

a plurality of contacts for bit lines, which are formed between the pair of the gate electrode patterns for each of the active regions and self-aligned with the first spacers, for electrically connecting the active regions to the bit line patterns;

a second interdielectric layer formed on an entire surface of the first interdielectric layer in which the bit line patterns are formed; and a plurality of storage electrodes including contacts formed on each outer end of the pair of the gate electrode patterns for each of the active regions and simultaneously self-aligned with the second and first spacers, for electrically connecting the active regions to storage electrodes of a capacitor, wherein each contact for a storage electrode is arranged offset with respect to the pair of the gate electrode patterns on which the contact for the storage electrode is formed so as to increase a spaced-apart distance between a corresponding contact for a bit line and the contact for the storage electrode.

2. The semiconductor memory device having self-aligned contacts according to claim 1, wherein the contacts for bit lines are projected to a predetermined height upwards from the surfaces of the gate electrode patterns.

3. The semiconductor memory device having self-aligned contacts according to claim 1, wherein the contacts for storage electrodes are formed between the same gate electrode patterns among the plurality of gate electrode patterns, and the center of the contacts for storage electrodes is formed in a staggered row arrangement along a vertical direction.

4. The semiconductor memory device having self-aligned contacts according to claim 1, wherein each contact for a storage electrode contacts a first spacer of a first gate electrode pattern of the pair of the gate electrode patterns and a spacer and a mask of a second gate electrode pattern of the pair of gate electrode patterns, wherein a second spacer and a mask of the first gate electrode pattern is contacted by a contact for bit line.

* * * * *